United States Patent
Ammann

(10) Patent No.: US 6,929,437 B1
(45) Date of Patent: Aug. 16, 2005

(54) SPINDLE WITH AXIALLY ACTING COLLET-OPENING DEVICE

(75) Inventor: Beat Ammann, Mendrisio (CH)

(73) Assignee: Ballado Investments, Inc., Obarrio Panama City (PA)

(*) Notice: Subject to any disclaimer, the term of this patent is extended or adjusted under 35 U.S.C. 154(b) by 0 days.

(21) Appl. No.: 10/480,050

(22) PCT Filed: Feb. 4, 2003

(86) PCT No.: PCT/IB03/00365

§ 371 (c)(1),
(2), (4) Date: Dec. 9, 2003

(87) PCT Pub. No.: WO03/070424

PCT Pub. Date: Aug. 28, 2003

(30) Foreign Application Priority Data

Feb. 22, 2002 (CH) .................................... 0317/02

(51) Int. Cl.[7] .............................................. B23C 5/26
(52) U.S. Cl. ................................. 409/233; 408/239 R
(58) Field of Search .............................. 409/231–234; 408/239 R, 240

(56) References Cited

U.S. PATENT DOCUMENTS

| 4,605,349 | A | * | 8/1986 | Bone .......................... 409/233 |
| 4,790,700 | A | * | 12/1988 | Schwartzman .............. 409/233 |
| 4,986,704 | A | | 1/1991 | Narushima et al. |
| 6,287,059 | B1 | * | 9/2001 | Hashidate et al. .......... 409/233 |

FOREIGN PATENT DOCUMENTS

| DE | 3824581 A1 | * | 1/1990 |
| EP | 0 271 355 | | 6/1988 |
| EP | 0 909 601 | | 4/1999 |

* cited by examiner

*Primary Examiner*—Erica Cadugan
(74) *Attorney, Agent, or Firm*—Young & Thompson

(57) ABSTRACT

A spindle for machining at high rotational speeds, includes a tool-holding taper collet with radial slits that is kept closed to clamp a tool by pressing it axially against a seat of complementary shape by the reaction force of precompressed elastic elements interposed between the tool-holding collet and the body of the spindle, and is opened by moving it axially away from the seat by applying an axial force to it to further compress the precompressed elastic elements. In the spindle the elastic means are a sleeve of elastic material housed coaxially between the inside wall of a cavity formed in the body of the spindle and a shaped collar of epoxy resin applied coaxially around the outer surface of the free end of the tool-holding collet.

4 Claims, 2 Drawing Sheets

SPINDLE WITH AXIALLY ACTING COLLET-OPENING DEVICE

CROSS-REFERENCE TO RELATED APPLICATIONS

This is the 35 U.S.C. 371 National Stage of International Application PCT/IB03/00365, filed on Feb. 4, 2003, which designated the United States of America.

FIELD OF THE INVENTION

The present invention relates to machine tools that use spindles that rotate at high speeds, such as those of drilling assemblies for printed circuit boards.

More particularly, the invention relates to a spindle of the abovementioned type fitted with a tool-holding taper collet that can flex elastically to clamp the tool owing to the existence of a number of radial slits which give it the necessary elasticity. In these spindles, as is known to those skilled in the art, closure of the tool-holding collet is achieved by drawing it into a complementary tapering cavity, causing the various sectors of the end part of the clamp which are separated by the abovementioned radial slits to flex, squeezing and clamping the tool between themselves.

The collet is inserted into the said complementary cavity by the reaction of precompressed elastic means interposed between the body of the tool-holding collet and the body of the spindle. If an axial force is then applied to the said collet, further compressing the abovementioned elastic means by a suitable amount, the contrary effect is obtained, that is the collet is opened allowing the tool to be extracted from it.

BACKGROUND OF THE INVENTION

In the prior art, the elastic means described above take the form of a series of Belleville washers arranged coaxially around the tool-holding collet, which are in contact with a special part of the collet, on which they exert a predetermined pressure due to the abovementioned precompression, keeping it closed during machining. If an axial force is applied to the tool-holding collet, via a rod passing through the interior of the spindle cavity containing the Belleville washers, the latter are further compressed to bring about this opening action of the collet.

However, the system described above has certain troublesome drawbacks: firstly, at the extremely high rotational speeds of the spindle that are currently achievable (over 100,000 rpm), the said Belleville washers are drawn round by the rotation, creating effects of unbalance which cause vibrations harmful to machining accuracy. Also, to accommodate Belleville washers with specifications suitable for the job, a large-diameter cavity must be formed in the spindle, which means that the spindle itself must have a large diameter and consequently a large mass.

Moreover, with the system currently in use, it is necessary, as already discussed, to operate from the outside with a rod which must move cyclically into contact with the end of the tool-holding collet and exert upon it a force (of the order of some 2,000 N) which, over time, owing in part to the situation of point loading that occurs, can deform the tip and/or alignment of the rod, causing problems of accuracy and service life.

In order to solve all the problems listed briefly above, the inventor of the present innovation has devised a spindle of the type defined above, in which the said elastic means are not Belleville washers but instead a sleeve of elastic material (rubber or another elastomer) which also, under conditions of precompression, keeps the tool-holding collet in the closed position as described. This sleeve is fitted onto the free end of an extension of the said tool-holding collet, which ends near the corresponding end of the spindle, and can be reached without having to insert, as discussed, a long rod down into the body of the spindle.

In order for the radial expansion of the said sleeve not to create braking forces on the tool-holding collet, there is installed between the collet and the sleeve a shaped steel or epoxy resin collar which, having a low coefficient of friction, does not significantly oppose the axial movement of the tool-holding collet.

For similar reasons there is interposed, between the body of the spindle and the tool-holding collet, in that part of its extension which is not surrounded by the abovementioned sleeve, an epoxy resin bush, which can be formed inside the spindle itself during the assembly operation and has a low coefficient of friction and permits movements in the axial direction of the tool-holding collet with virtually zero play.

SUMMARY OF THE INVENTION

The subject of the present invention is therefore a spindle for machining at high rotational speeds as described herein.

A more detailed description will now be given of a preferred illustrative embodiment of a spindle according to the invention, selected from among the many that could be produced by a person skilled in the art in keeping with the teachings contained herein.

BRIEF DESCRIPTION OF THE DRAWINGS

In the course of this description reference will also be made to the appended drawings, which show.

DETAILED DESCRIPTION OF THE INVENTION

Figure 1:
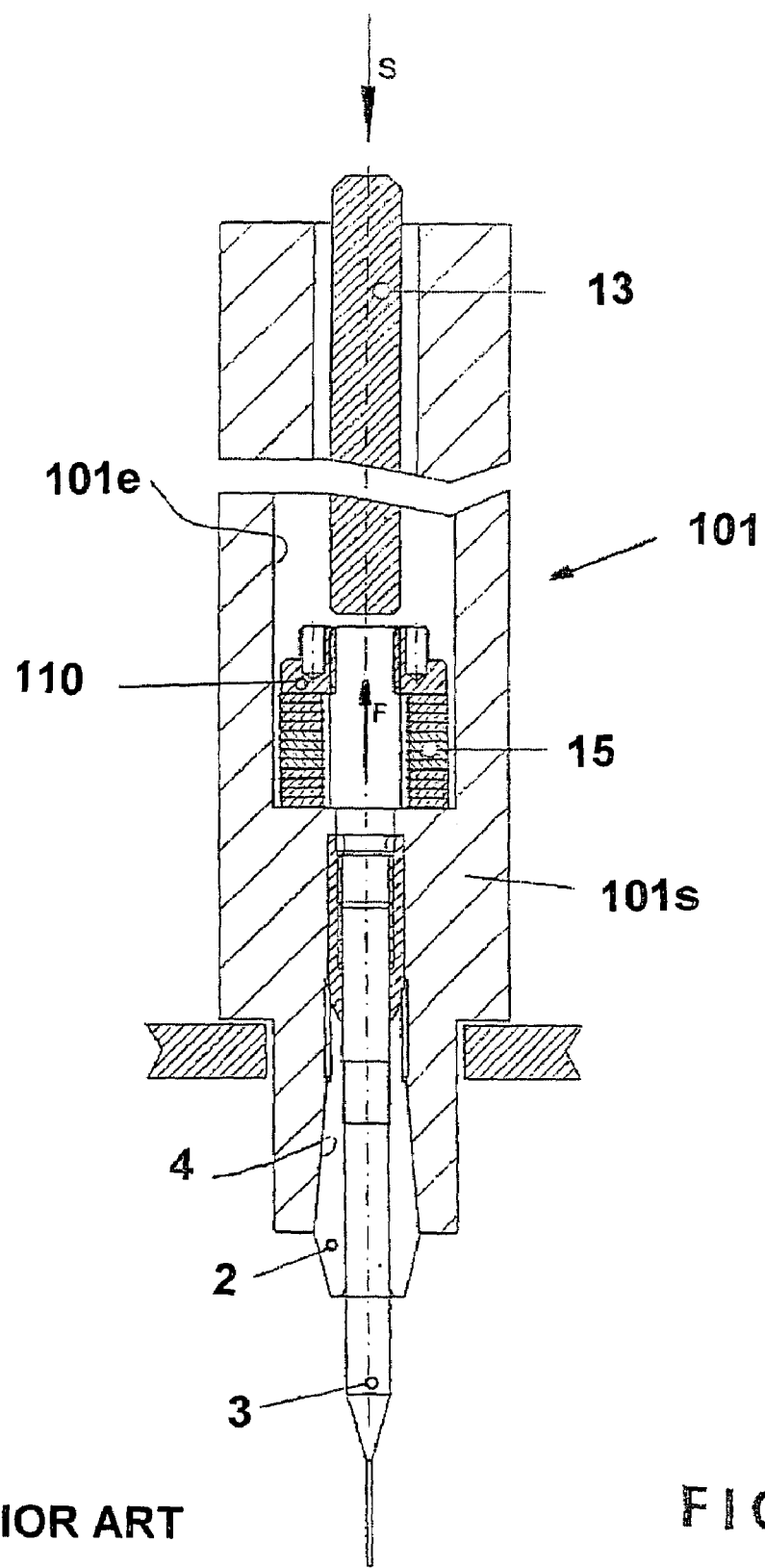
in FIG. 1, a longitudinal section, reduced in length, through a spindle of the type described above produced in accordance with the prior art.

To begin with FIG. 1, this shows that a spindle 101 in accordance with the prior art consists of a body 101s provided with a cavity 101e in which a tool-holding collet 2 is inserted coaxially, with a drilling tool 3 inserted in turn into the latter.

On the free end of the said tool-holding collet 2 is a flange 110 that is in contact with the series 15 of superposed Belleville washers arranged coaxially around the said tool-holding collet 2. The Belleville washers are precompressed by a suitable amount when the spindle 101 and the tool-holding collet are assembled, so that their elastic reaction exerts a force F on the abovementioned flange 110 such as to push the tapered part of the tool-holding collet 2 into a cavity 4 of complementary shape formed in the body 101s of the spindle. This causes it to contract elastically and clamps the tool 3 inside it. As already mentioned, this contraction is made possible by the existence of a number of radial slits (not shown in the drawings but obvious to those skilled in the art) formed in that part of the tool-holding collet which is intended to accommodate the shank of the tool.

To open the tool-holding collet 2, which will be abbreviated to "collet" below, a force S is applied in the opposite direction to the said reaction force F of the series of Belleville washers 15. This further compresses the washers and causes the collet 2 to move axially far enough to disengage its tapered part from the seat 4, so that it opens due to the elastic return of the sectors of its part that contains the tool 3 shank, these sectors being separated from each other by the abovementioned radial slits.

This force S is applied through a rod 13 aligned coaxially with the collet 2, which is cyclically pressed against the aforesaid end part of the collet 2 to which the flange 110 is attached.

Figure 2:
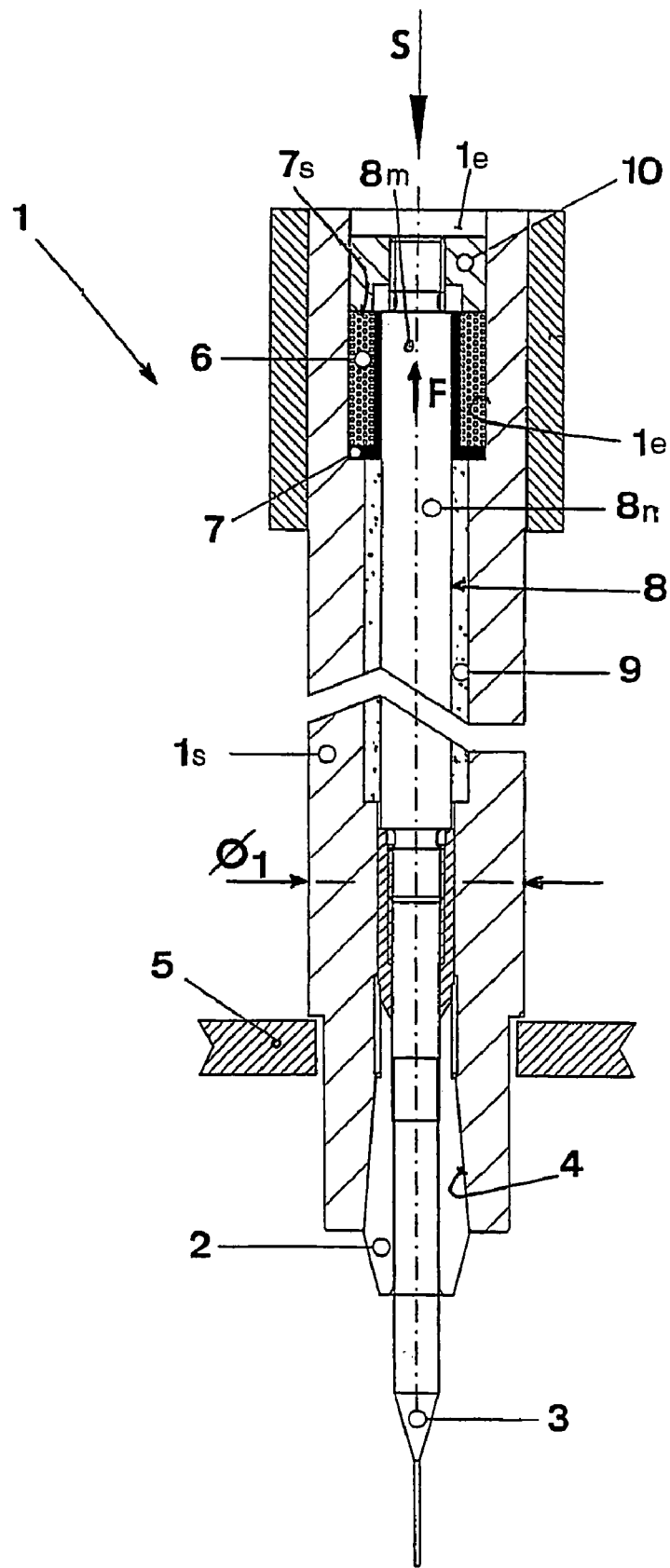
in FIG. 2, a longitudinal section, reduced in length, through a spindle of the same type as in FIG. 1, but produced in accordance with the invention.

FIG. 2 by contrast shows that a spindle 1 according to the invention likewise has a body 1s provided with a coaxial cavity 1e that contains the tool-holding collet 2 to which a tool 3 is fixed. In this case the collet 2 is provided with an extension 8, on the free end 8m of which is fitted a flange 10, the longitudinal section which is in the shape of an inverted U, with the two sides of the U pressing via their ends against the surface 7s of a sleeve 6 of precompressed elastic material, for example rubber, which is housed coaxially between the inner wall of the said cavity 1e of the body 1s of the spindle 1 and a shaped steel or epoxy resin collar 7 applied coaxially to the outer surface of the said end 8m of the extension 8 of the collet 2. As already stated, the function of this shaped collar is to prevent interference between the sleeve 6, when it deforms radially, and the collet 2, which could otherwise undesirably increase the force S necessary to move the collet 2 axially to open it.

The operations of closing and opening the collet 2 are similar to those already described with reference to the case discussed earlier: the elastic reaction F of the precompressed sleeve 6 on the said inverted-U flange 10 of the collet 2 holds the latter in the closed, tool-clamping position, and to open the collet 2, the said force S is applied to the end 8m of its extension 8, further compressing the elastic sleeve 6 and moving the said collet 2 axially the necessary distance. To facilitate the axial movement of the collet the inventor has interposed, between the part 8n of the said extension 8 of the collet 2 which is not surrounded by the said elastic sleeve 6 and the body 1s of the spindle 1, a bush 9 of epoxy resin with a low coefficient of friction, which as mentioned earlier can be injected during the actual assembly stage, producing a fit with virtually zero play that permits relative movements between the collet 2 and the spindle 1 in precise alignment with their longitudinal axes, which coincide precisely with each other.

As already noted, owing to the characteristics of the component parts of the spindle 1 of the invention, and in particular those of the elastic sleeve 6, the spindle 1 according to the invention achieves the desired object, making the cavity 1e of the spindle 1 of a much smaller diameter compared with spindles of conventional type: a comparison of FIGS. 1 and 2, which basically show the spindles at the same scale, will show that the outside diameter $Ø_1$ of the spindle 1 of the invention is about 25% less than the outside diameter $Ø_{101}$ of a spindle 101 of conventional type.

Though this is well known to those skilled in the art, it is relevant to add a final detail on how both spindles 1 and 101 described above work: when the said force S is being applied to the collet 2 to open it by moving it axially relative to the body of the spindle, the body is prevented from moving by supporting it against a fixed contact surface 5.

What is claimed is:

1. Spindle (1), having a longitudinal axis and a body, for machining at high rotational speeds, comprising a tool-holding taper collet (2) with radial slits (2r) that is kept closed to clamp a tool (3) by pressing the collet axially against a seat (4) of complementary shape by the reaction force (F) of precompressed elastic means (6) interposed between the tool-holding collet (2) and the body (1s) of the spindle (1), and is opened by moving the collet axially away from said seat (4) by applying an axial force (S) to the collet to further compress said precompressed elastic means (6), which spindle is characterized in that said elastic means are a sleeve (6) of elastic material housed coaxially between the inside wall of a cavity (1e) formed in said body (1s) of the spindle (1) and a shaped collar (7) of epoxy resin applied coaxially around the outer surface of a free end (8m) of an extension (8) of the tool-holding collet (2).

2. Spindle according to claim 1, in which there is interposed between that part (8n) of said extension (8) of the tool-holding collet (2) which is not surrounded by said shaped collar (7), and the body (1s) of the spindle (2), a bush (9) which is also made of epoxy resin.

3. Spindle according to claim 2, in which said free end (8m) of the extension (8) of the tool-holding collet (2) is fitted securely with a flange (10), the longitudinal section of which is an inverted U, with the two sides of the U pressing via their ends against that surface (7s) of said sleeve (6) which is furthest from the inner end of said cavity (1e) of the spindle (1).

4. Spindle according to claim 1, in which said free end (8m) of the extension (8) of the tool-holding collet (2) is fitted securely with a flange (10), the longitudinal section of which is an inverted U, with the two sides of the U pressing via their ends against that surface (7s) of said sleeve (6) which is furthest from the inner end of said cavity (1e) of the spindle (1).

* * * * *